(12) United States Patent
Sakata et al.

(10) Patent No.: US 6,729,823 B2
(45) Date of Patent: May 4, 2004

(54) PROCESSING SYSTEM FOR OBJECT TO BE PROCESSED

(75) Inventors: Kazunari Sakata, Shiroyama-Machi (JP); Yasushi Takeuchi, Shiroyama-Machi (JP)

(73) Assignee: Tokyo Electron Limited, Tokyo-To (JP)

(*) Notice: Subject to any disclaimer, the term of this patent is extended or adjusted under 35 U.S.C. 154(b) by 32 days.

(21) Appl. No.: 09/934,757

(22) Filed: Aug. 23, 2001

(65) Prior Publication Data

US 2002/0048509 A1 Apr. 25, 2002

(30) Foreign Application Priority Data

Aug. 23, 2000 (JP) .......................... 2000-253202
Nov. 27, 2000 (JP) .......................... 2000-358600

(51) Int. Cl.[7] .............................. B65G 1/06; H01L 21/68
(52) U.S. Cl. ..................................... 414/217; 414/331.1
(58) Field of Search .............................. 414/217, 217.1, 414/939, 940, 331.1

(56) References Cited

U.S. PATENT DOCUMENTS

| | | | | |
|---|---|---|---|---|
| 4,927,438 A | * | 5/1990 | Mears et al. ............... 55/385.2 |
| 4,986,715 A | * | 1/1991 | Asakawa ..................... 414/331 |
| 6,079,927 A | * | 6/2000 | Muka .......................... 414/217 |
| 6,080,060 A | * | 6/2000 | Larsson ....................... 454/187 |
| 6,188,323 B1 | * | 2/2001 | Rosenquist et al. ...... 340/686.5 |
| 6,224,679 B1 | * | 5/2001 | Sasaki et al. ................ 118/719 |
| 6,318,946 B1 | * | 11/2001 | Tsay et al. ............. 414/222.01 |
| 6,368,208 B1 | * | 4/2002 | Minoshima .................. 454/187 |
| 6,390,754 B2 | * | 5/2002 | Yamaga et al. ............. 414/217 |
| 6,420,864 B1 | * | 7/2002 | Abraham et al. ........ 324/158.1 |

FOREIGN PATENT DOCUMENTS

| | | |
|---|---|---|
| JP | 4-302454 | 10/1992 |
| JP | 5-267432 | 10/1993 |
| JP | 6-334019 | 12/1994 |
| JP | 11-288991 | 10/1999 |
| JP | 2000-16583 | 1/2000 |
| JP | 2000-174110 | 6/2000 |

* cited by examiner

Primary Examiner—James W. Keenan
Assistant Examiner—Charles A. Fox
(74) Attorney, Agent, or Firm—Smith, Gambrell & Russell, LLP

(57) ABSTRACT

A processing system for an object to be processed has a housing defining a closed space. The housing is provided with an opening through which an airtight carrying box is carried in and carried out. The carrying box hermetically contains the object to be processed. A lid operating mechanism for opening and closing the lid of the carrying box is disposed near the opening. A contamination preventing duct covers a space around the lid of the carrying box and supplies a clean gas of a high cleanliness therein at least when the lid of the carrying box is opened.

18 Claims, 13 Drawing Sheets

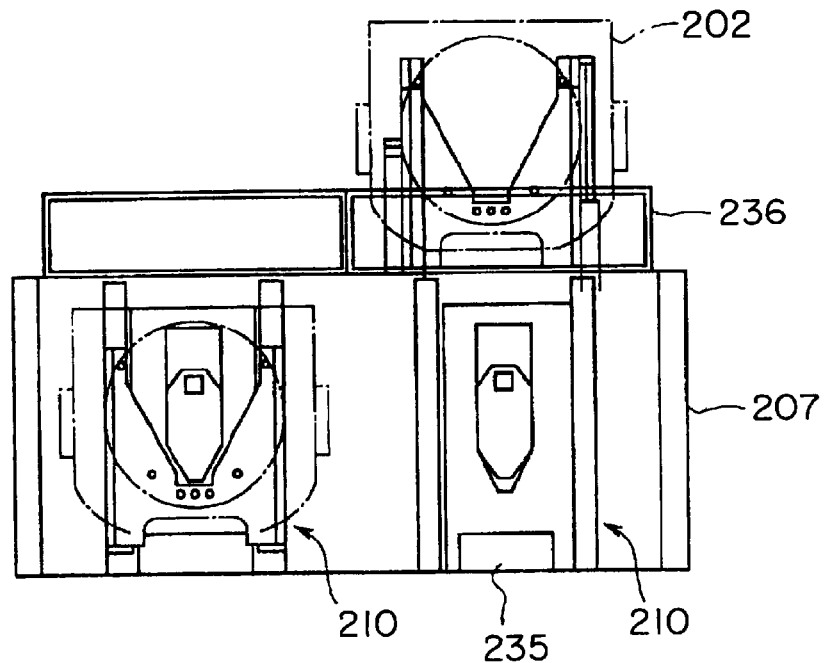
F I G. 11
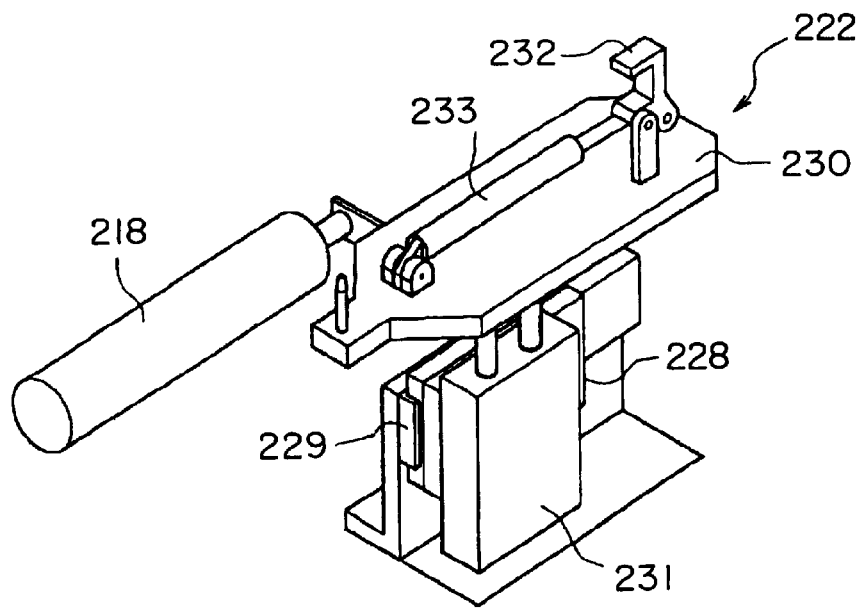
F I G. 12

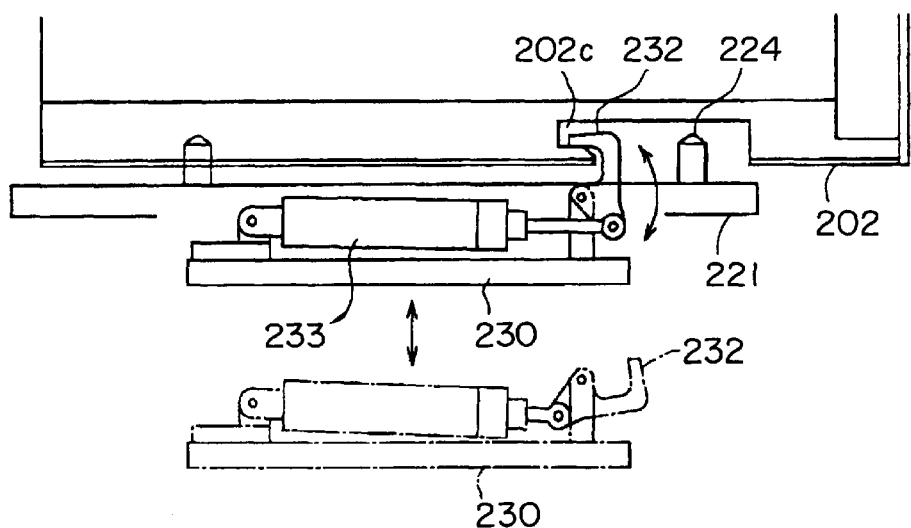
F I G. 14
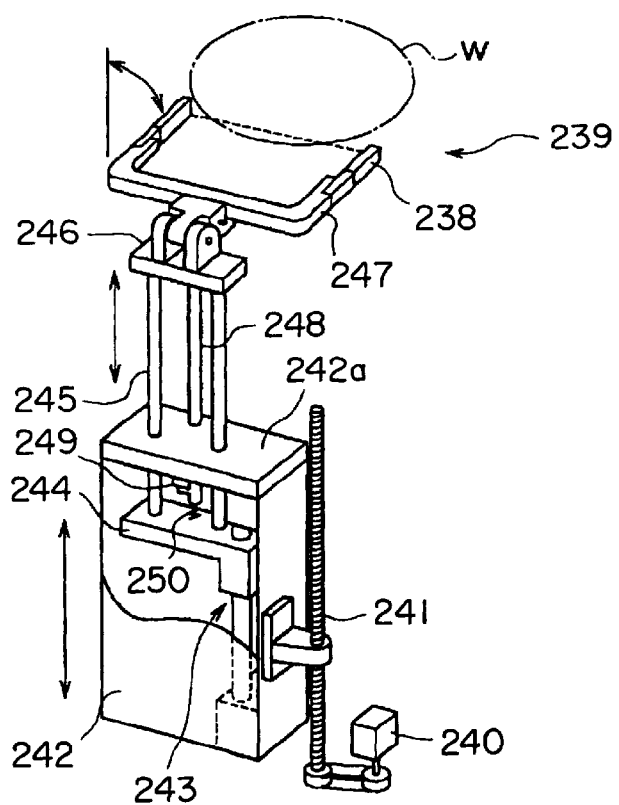
F I G. 15

PROCESSING SYSTEM FOR OBJECT TO BE PROCESSED

BACKGROUND OF THE INVENTION

1. Field of the Invention

The present invention relates to a processing system that uses a carrying (containing) box capable of hermitically holding an object to be processed, such as a semiconductor wafer.

2. Description of the Related Art

Generally, when fabricating a semiconductor integrated circuit, such as an IC or a LSI device, a semiconductor wafer is subjected repeatedly to film deposition processes, oxidation-enhanced diffusion processes, etching processes and so on. The semiconductor wafer needs to be transferred from one to another one of those systems for carrying out those processes. As generally known, contamination of the surface of the semiconductor wafer with particles and formation of an oxide film by natural oxidation on the surface of the semiconductor wafer must be avoided in order to process the semiconductor wafer at an improved yield. Thus, there is a growing tendency to use a carrying box capable of sealing wafers therein for carrying wafers with the progressively growing device miniaturization and level of integration.

As shown in FIGS. 6 to 8, a conventional carrying box 502 for carrying semiconductor wafers W has a box body 506 having an open front side 504 and a substantially semicircular side wall. Supporting projections 508 are arranged at vertical intervals on the inner surface of the box body 506. Peripheral parts of semiconductor wafers W are supported on the supporting projections 508 so that the semiconductor wafers W are contained in a tier-like manner at substantially equal intervals in the box body 506. Usually, twenty-five or thirteen semiconductor wafers W are contained in the carrying box 502.

A square, hollow, flat lid 510 is detachably attached to the box body 506 so as to cover the open front side 504 of the box body 506. The box body 506 is properly sealed to maintain an atmosphere of an inert gas, such as $N_2$ gas, therein so that the wafers W contained in the box body 506 are prevented from contacting the atmosphere as far as possible.

The lid 510 is provided with two locking mechanisms 512. The lid 510 can be removed from the box body 506 to open the open front side 504 by releasing the locking mechanisms 512.

More concretely, each of the locking mechanisms 512 has a locking bolt operating plate 514 having the shape of a disk and turnably supported on the lid 510 at a substantially middle position with respect to the height of the lid 510. The locking bolt operating plate 514 is provided with a slot 516. Circular motion of the locking bolt operating plate 514 is changed into linear motion of locking bolts 520 by crank mechanisms. One end of a link 518 is pivotally connected to the locking bolt operating plate 514, and the other end thereof is pivotally connected to one end of the locking bolt 520. When the locking bolt operating plate 514 is turned through an angle of 90°, in opposite directions, the locking bolts 520 are vertically moved between a locking position and an unlocking position.

As shown in FIGS. 6 and 7, free end parts of the locking bolts 520 can be engaged (inserted) in slots 522 formed in the upper and the lower section of the rim defining the open front side 504. In FIG. 7, only the slots 522 formed in the lower rim are shown. When the locking bolts 520 are engaged in the slots 522 with the lid 510 set in place on the box body 506 so as to cover the open front side 504, the lid 510 cannot be removed from the open front side 504.

The locking bolt operating plate 514 at a locking position shown in FIG. 8(a) can be turned through an angle of 90° to an unlocking position shown in FIG. 8(b) by means of a lock operating member, not shown, engaged in the slot 516 of the locking bolt operating plate 514. Consequently, the locking bolts 520 can be retracted by a distance ΔL from the slots 522 (FIG. 7) in order to unlock the lid 510.

Generally, the carrying box 502 is carried automatically in a processing system that includes: an automatic carrying-box carrying mechanism, a storage area for temporarily storing the carrying box, processing units for actually conducting predetermined processes to semiconductor wafers, and the like. The lid 510 of the carrying box 502 is automatically locked and unlocked by an automatic machine provided with the lock operating member according to the aforesaid procedure and is put on and removed from the box body 506 automatically.

Such processing systems are disclosed in, for example, JP-A No. Hei 4-180213 and Japan Patent Appln. No. Hei 11-201000 (patent application previously made by the applicant of the present patent application). An inert gas, such as $N_2$ gas, or clean air with a high cleanliness is supplied into those systems.

The lid 510 may be removed temporarily to obtain information about the semiconductor wafers contained in the carrying box 502 before carrying the carrying box 502 into a processing system. Then, a mapping operation may be carried out to confirm the positions of the wafers and/or an identifying inspection may be carried out to identify the individual wafers.

Whereas the cleanliness of the atmosphere surrounding the processing system is on the order of class 10000, the interior of the processing system is maintained at a very high cleanliness on the order of class 1. Particles are prevented from entering the processing system.

In the conventional processing system, in a clean atmosphere, the lid 510 is temporarily removed from the box body 506 of the carry box 502 and operations for acquiring information about the semiconductor wafers, such as a mapping operation, is carried out. Although the operations including the mapping operation are carried out in the clean atmosphere of a high cleanliness, there is a tendency that problems often arise because particles deposited on the outer surface of the carrying box 502 in an atmosphere of a low cleanliness, such as a class 10000 atmosphere, may enter the carrying box 502 and adhere to the wafers when the lid 510 is removed.

Solution of such problems is desired particularly in recent years where the miniaturization of semiconductor devices has progressed to use semiconductor integrated circuits including lines of a submicron width and diameter of semiconductor wafers has increased from 6 in. via 8 in. to 12 in.

In addition, since a table for supporting a carrying box is placed in a housing in a conventional vertical heat treatment apparatus, the carrying box cannot be transferred between the table and an overhead conveying device supported on the ceiling of a clean room, that is, it is difficult to use the overhead conveying device. In a single-wafer processing apparatus that processes wafers one by one, a table may be disposed on the outer side of a gate to enable transferring a wafer between the table and an overhead conveying device. However, since the lid of the carrying box is removed on the table and the wafer is taken out of the carrying box, this arrangement cannot be applied to batch processing.

SUMMARY OF THE INVENTION

The present invention has been made in view of the foregoing problems to solve those problems effectively. Accordingly, it is an object of the present invention to provide a processing system using a carrying box for holding an object to be processed therein provided with a lid and capable of preventing the entrance of particles adhering to the outer surface of the carrying box into the carrying box when the lid is removed.

Another object of the present invention is to provide a processing system capable of using an overhead conveying device and of carrying out a batch-type process.

According to the present invention, a processing system for an object to be processed includes: a housing defining a closed space, the housing provided with an opening through which an airtight carrying box is carried in and out, the carrying box hermetically containing therein the object to be processed and provided with a detachable lid; a lid operating mechanism disposed near the opening to open and close the lid of the carrying box; and a contamination preventing duct capable of covering a space around the lid of the carrying box and of supplying a clean gas of a high cleanliness therein at least when the lid of the carrying box is opened.

According to the above feature, when removing the lid of the carrying box, the lid is covered with the duct and the clean gas of a high cleanliness flows through the duct. Thus, entrance of particles adhering to an outer surface of the carrying box into the temporarily opened carrying box can be prevented.

Preferably, a blower is disposed near the opening to blow the clean gas of a high cleanliness into the contamination preventing duct.

Preferably, a filter means is disposed near the opening to filter a gas to produce the clean gas of a high cleanliness.

Preferably, the blower and the filter means are mounted on a common frame, and an outlet end of the frame is spaced a short distance apart from the contamination preventing duct.

Preferably, the contamination preventing duct is capable of being moved vertically between a working position where the contamination preventing duct covers the lid and a waiting position apart from a path along which the carrying box moves.

Preferably, an information acquiring means that acquires information about the object to be processed contained in the carrying box is disposed near the opening.

Preferably, the information acquiring means is capable of being moved vertically between an information acquiring position where the information acquiring means faces the carrying box and a waiting position apart from a path along which the carrying box moves.

Preferably, the contamination preventing duct is adapted to cover the space around the lid of the carrying box and the clean gas of a high cleanliness is adapted to flow through the contamination preventing duct when the information acquiring means functions to acquire information about the object to be processed contained in the carrying box.

Thus, the lid is opened and closed and the information acquiring means operates for information acquisition in the contamination preventing duct through which the clean gas of a high cleanliness flowing. Accordingly, the entrance of particles into the carrying box can be substantially perfectly prevented even if particles are scattered because the clean gas carries the scattered particles away.

Preferably, a storage unit for temporarily storing the carrying box therein is installed in the housing.

Preferably, a processing unit for conducting a predetermined process to the object to be processed contained in the carrying box is installed in the housing.

In addition, according to the present invention, a processing system for an object to be processed includes: a housing defining a closed space, the housing provided with an opening through which an airtight carrying box is carried in and out, the carrying box hermetically containing therein the object to be processed and provided with a detachable lid; a conveying mechanism installed in the housing for conveying the carrying box; a table disposed outside the opening for supporting the carrying box thereon; and a moving mechanism provided at the table for moving the carrying box to a transfer position where the carrying box can be transferred to the conveying mechanism.

The processing system with the above feature enables the use of an overhead conveying mechanism or the like and batch-type processing, and enhances processing ability.

Preferably, the moving mechanism includes a fixing mechanism for temporarily fixing the carrying box. The fixing mechanism prevents the carrying box placed on the table from being carried away mistakenly by the operator.

Preferably, two moving mechanisms are incorporated into the one table. Preferably, the two moving mechanism are capable of laterally moving toward a center therebetween.

Thus, the two moving mechanisms can be positioned in a narrow operating range of the conveying mechanism, and the processing system can be formed in compact construction, and throughput of the processing system can be enhanced.

Preferably, a lid operating mechanism for opening and closing the lid of the carrying box is incorporated into the table.

Preferably, an information acquiring means that acquires information about the object to be processed contained in the carrying box is incorporated into the table.

Preferably, an electrical unit is disposed below the transfer position where the carrying box can be transferred from the moving mechanism to the conveying mechanism.

Such disposition of the electrical unit facilitates arrangement of cables and enables the processing system to be formed in compact construction.

BRIEF DESCRIPTION OF THE DRAWINGS

FIG. 11 is a plan view of a table;

FIG. 12 is a perspective view of a fixing mechanism;

FIG. 14 is a side elevation of assistance in explaining an operation of the fixing mechanism;

FIG. 15 is a perspective view of an information acquiring mechanism; and

DESCRIPTION OF THE PREFERRED EMBODIMENTS

Preferred embodiments of the present invention will be described hereinafter with reference to the accompanying drawings.

Figure 1:
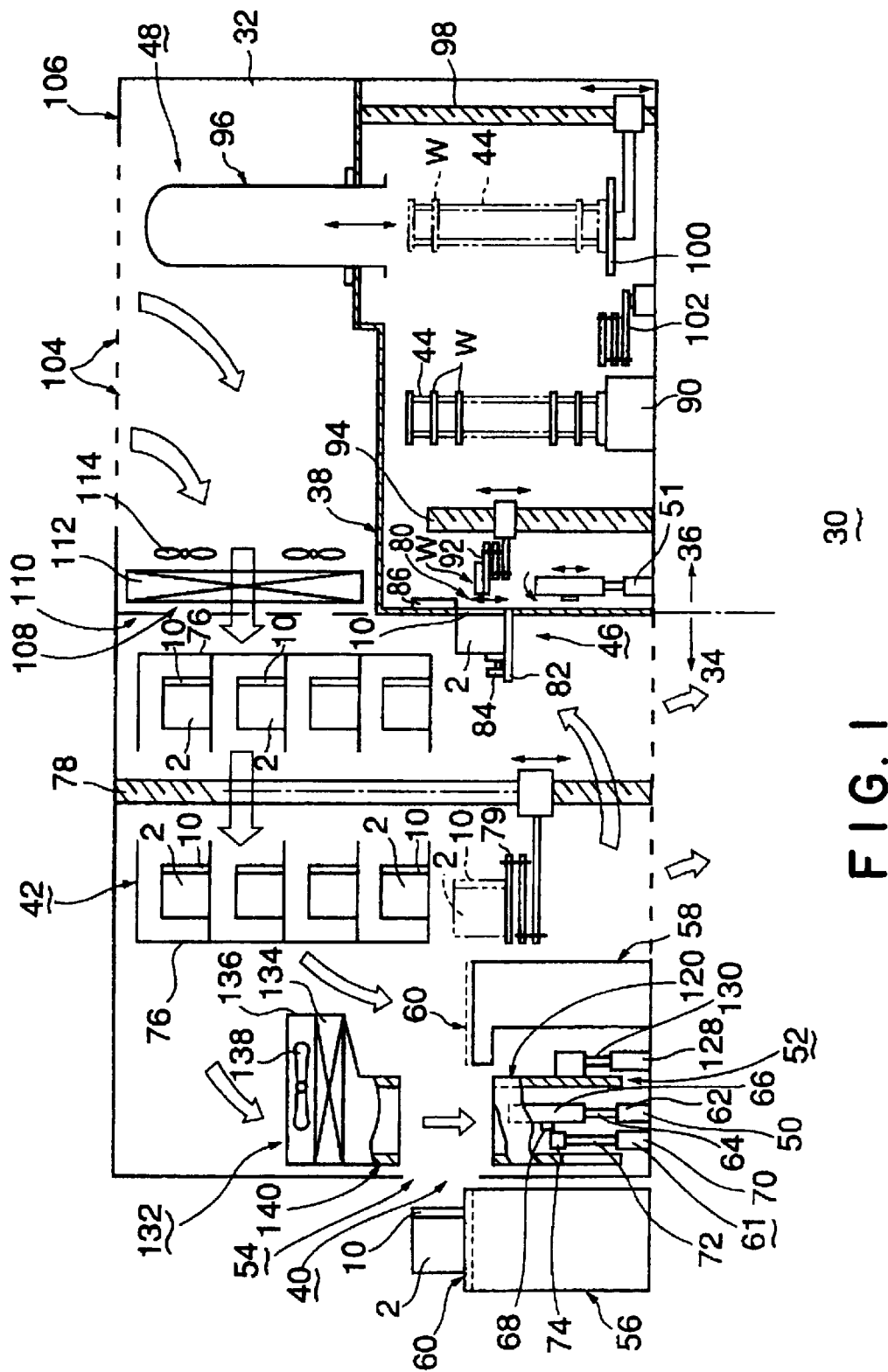
FIG. 1 is a schematic view of a processing system for an object to be processed in a first embodiment according to the present invention.
Figure 2:
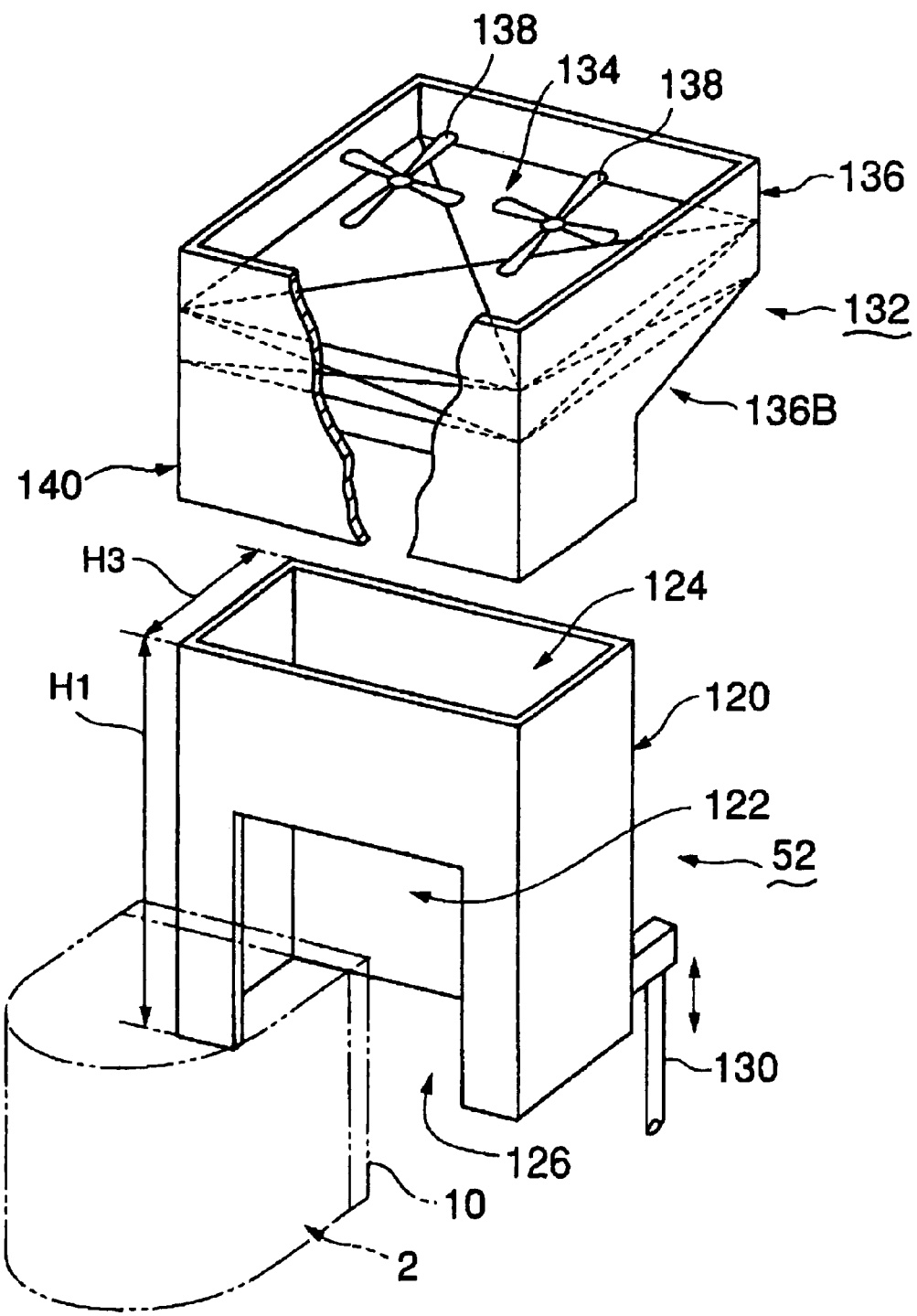
FIG. 2 is a schematic perspective view of a contamination preventing duct shown in FIG. 1.
Figure 3:
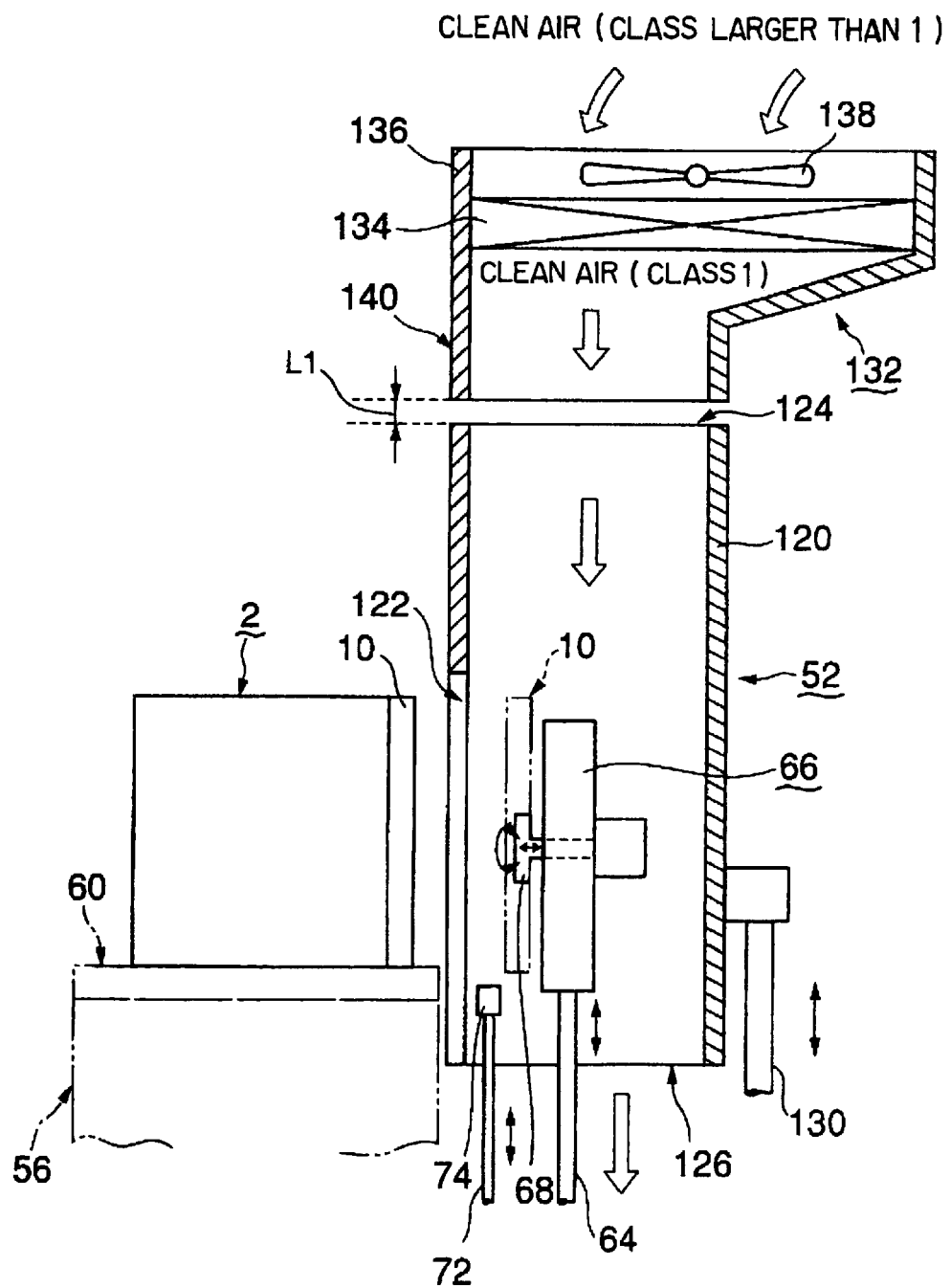
FIG. 3 is a sectional view of the contamination preventing duct shown in FIG. 1.

FIG. 1 is a schematic view of a processing system for an object to be processed in a first embodiment according to the present invention, FIG. 2 is a schematic perspective view of a contamination preventing duct shown in FIG. 1, and FIG. 3 is a sectional view of the contamination preventing duct.

Referring to FIG. 1, a processing system 30 is enclosed with a housing 32 made of, for example, a stainless steel. A partition wall 38 divides an interior of the housing 32 into a carrying-box handling area 34 in which an object-to-be-processed carrying box (referred to simply as "carrying box") 2 is conveyed, and a wafer handling area 36 in which semiconductor wafers W, i.e., objects to be processed, are conveyed. Clean air is supplied into the carrying-box handling area 34, and an inert gas atmosphere of an inert gas, such as $N_2$ gas, is created in the wafer handling area 36.

The processing system 30 has a port 40 through which the carrying box 2 is carried into and out of the processing system 30. The processing system includes, as essential components, a storage unit 42 (stocker) for temporarily storing the carrying box 2, a transfer stage 46 for supporting the carrying box 2 thereon while semiconductor wafers are transferred between the carrying box 2 and a wafer boat 44 (object-to-be-processed boat), a processing unit 48 for conducting a predetermined process to wafers held on the wafer boat 44, a first lid operating mechanism 50 disposed near the port 40, a second lid operating mechanism 51 disposed near the transfer stage 46, and a contamination preventing duct 52 that is a main feature of the present invention.

A normally open opening 54 is formed in the port 40 of the housing 32. An outside table 56 is disposed on the outer side of the opening 54, and an inside table 58 is disposed on the inner side of the opening 54. A carrying box 2 is delivered onto the outside table 56, slid on the outside table 56 and transferred to the inside table 58. A sliding plate 60 supporting the carrying box 2 thereon moves between a position on the outside table 56 and a position on the inside table 58. Although the tables 56 and 58 are spaced a long distance apart from each other in FIG. 1 to facilitate understanding, practically, the interval between the tables 56 and 58 is on the order of 10 cm.

The first lid operating mechanism 50 for temporarily opening and closing the lid 10 of the carrying box 2, an information acquiring device 61 and the contamination preventing duct 52 are disposed in a lower region on the inner side of the opening 54 between the opening 54 and the inside table 58. The first lid operating mechanism 50 and the information acquiring device 61 are vertically movable (appearable). The lid 10 of the carrying box 2 is temporarily removed to acquire information about the wafers contained in the carrying box 2, such as the number, the positions and the conditions of the wafers, by means of sensors.

Figure 6:
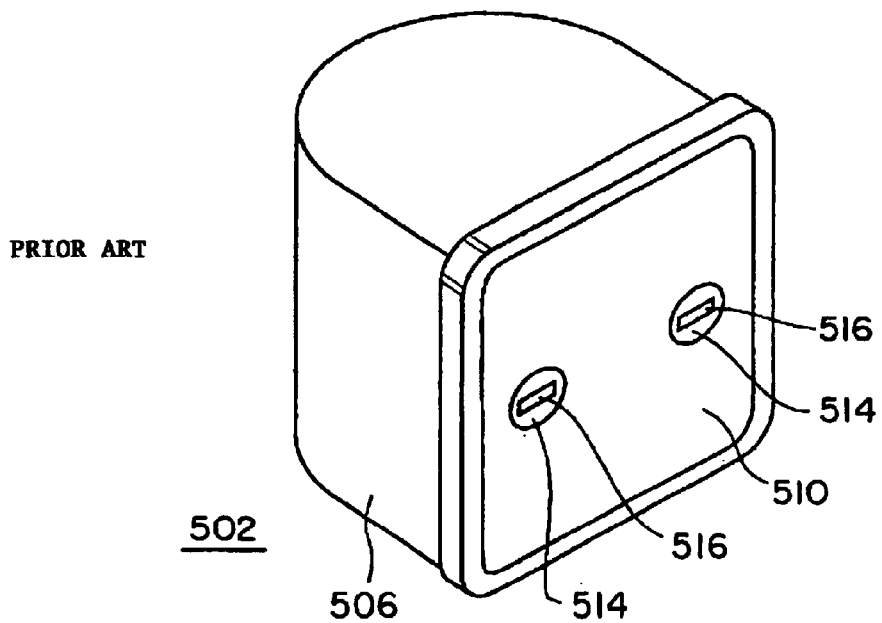
FIG. 6 is a perspective view of a prior art carrying box.
Figure 7:
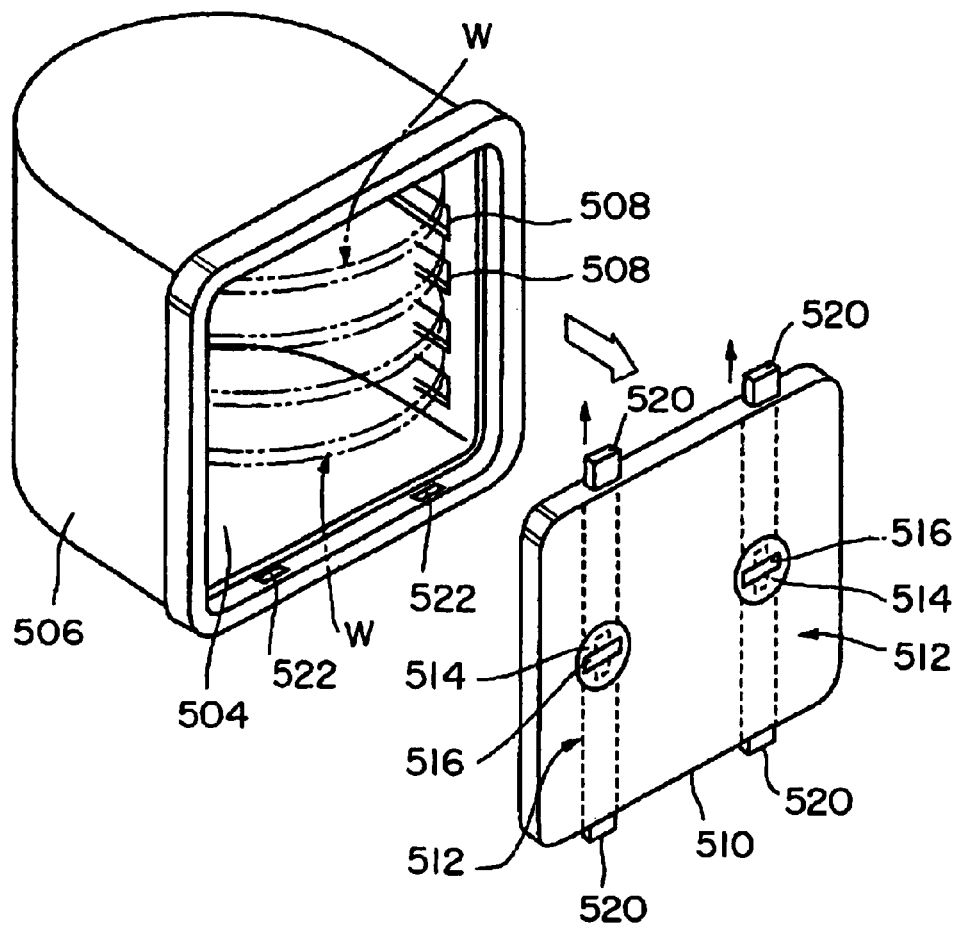
FIG. 7 is a perspective view of the prior art carrying box in a state wherein a lid is opened.
Figure 8:
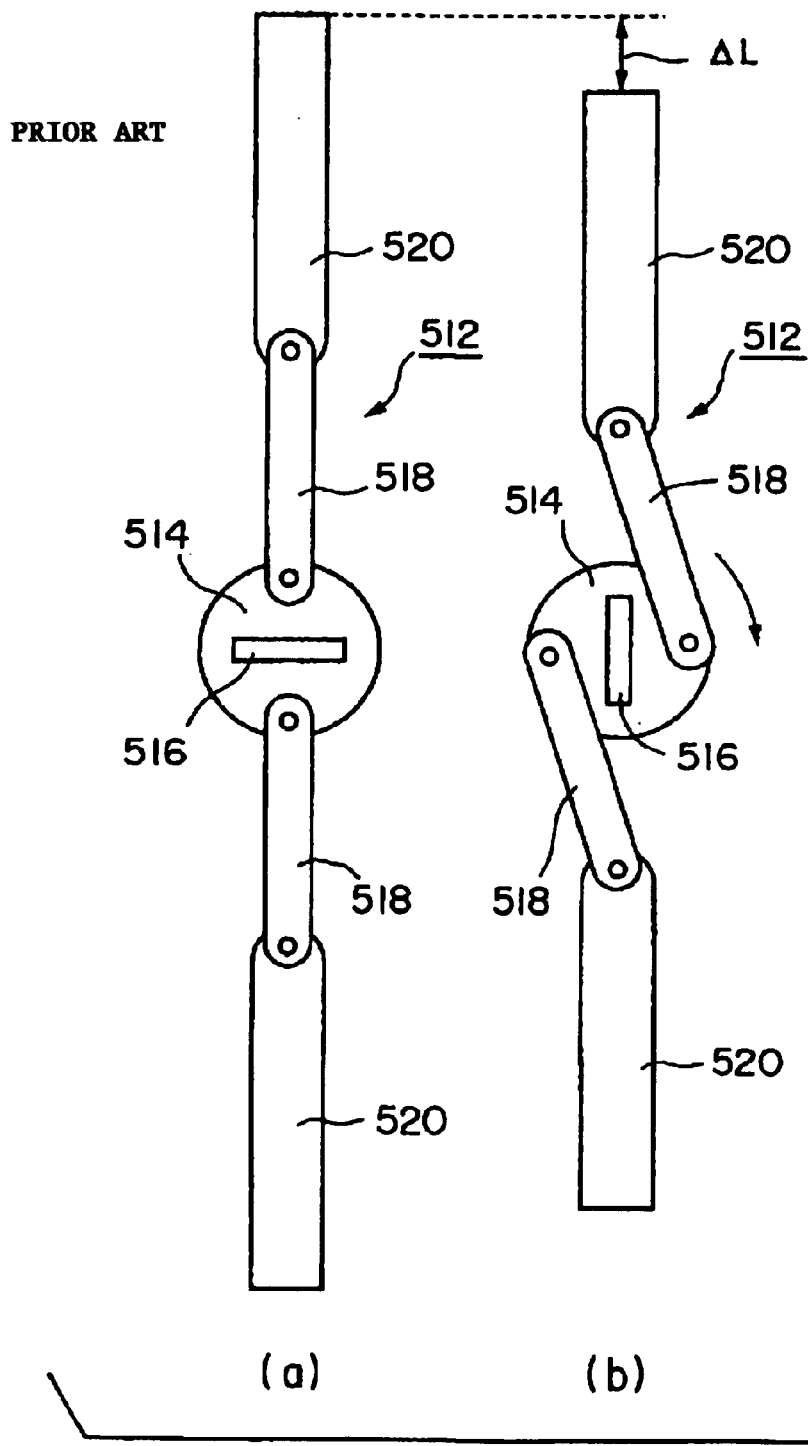
FIG. 8 is a front elevation of a prior art lid locking mechanism.

The first lid operating mechanism 50 includes a lifting rod 64, an actuator 62, such as a pneumatic cylinder actuator, for vertically moving the rod 64, and a lid operating body 66 supported on an upper end of the rod 64. The lid operating body 66 is provided with a pair of lock operating members 68 (only one of the lock operating members 68 is shown in FIG. 1) capable of being moved horizontally in opposite directions and of being turned in opposite directions. The lock operating members 68 are engaged in slots (516), turned in one of the opposite directions to fasten (engage) locking mechanisms (512) and turned in the other direction to unfasten (release) the locking mechanisms (512) (see FIGS. 6 to 8).

The information acquiring device 61 includes a lifting rod 72, an actuator 70, such as a pneumatic cylinder actuator, for vertically moving the rod 72, and a sensing head 74 held on an upper end of the rod 72. The sensing head 74 is provided with, for example, an optical detector, not shown, including a light-emitting device and a photodetecting device for detecting whether each wafer W exists. The sensing head 74 is moved vertically to scan the interior of the carrying box 2 while the lid 10 is removed, in order to detect whether each wafer exists. Thus, a mapping operation is achieved.

The storage unit 42 is installed in an upper region of the carrying-box handling area 34. The storage unit 42 shown in FIG. 1 has two storage racks 76 for temporarily storing carrying boxes 2. Each storage rack 76 is provided with four shelves each for supporting two carrying boxes 2. Thus, the storage unit 42 is able to store sixteen (=2×4×2) carrying boxes 2 temporarily.

An elevator 78 is installed between the two storage racks 76. The elevator 78 has a horizontal carrying arm 79 capable of turning, stretching and retracting. That is, the carrying arm 79 can be moved vertically while stretching and retracting. Thus, the carrying box 2 can be held by the carrying arm 79 to convey the carrying box 2 between the inside table 58 and the storage unit 42.

The partition wall 38 separating the areas 34 and 36 from each other is provided with an opening 80 of a size substantially equal to that of an open front side (504:FIG. 7) of the carrying box 2. A second table 82 having a horizontal support surface is disposed in the carrying-box handling area 34 near the opening 80. A carrying box 2 is adapted to be mounted on the second table 82. A horizontal actuator 84 is held on one side of the second table 82 in order to press the carrying box 2 mounted on the second table 82 horizontally against the partition wall 38. Thus, the carrying box 2 can be pressed closely to the rim of the opening 80 with the lid 10 thereof set facing the opening 80. Normally, a door 86 closes the opening 80.

The second lid operating mechanism 51, which may be the same in construction as the first lid operating mechanism 50, is disposed in a lower region contiguous with the opening 80 in the waver handling area 36.

Two wafer-boat support tables 90 (only one of the two wafer-boat support tables 90 is shown in FIG. 1) for supporting the wafer boat 44 are placed in the wafer handling area 36. A wafer transfer arm 92 capable of turning, stretching and retracting is disposed between the wafer boat support tables 90 and the transfer stage 46. An elevator 94 is adapted to move the wafer transfer arm 92 vertically. Thus, wafers W can be transferred between the carrying box 2 placed on the second table 82 and the wafer boat 44 supported on the wafer boat support table 90 by the wafer transfer arm 92 stretching, retracting, turning and vertically moved.

The wafer boat 44 is made of, for example, quartz and is capable of holding 50 to 150 wafers W at predetermined pitches in a vertical tier-like arrangement.

The processing unit 48 is disposed in an upper region on one side of the wafer handling area 36. The processing unit 48 has a vertical heat treatment furnace provided with a cylindrical processing vessel 96 made of quartz. Thus, a predetermined heat treatment process, such as a film deposition process, an oxidation-enhanced diffusion process or the like, can be conducted to a large number of wafers W simultaneously. A cap 100 is disposed below the processing vessel 96. An elevator 98 can move the cap 100 vertically. The wafer boat 44 is mounted on the cap 100, and then the cap 100 is elevated by the elevator 98 to load the wafers W held on the wafer boat 44 into the processing vessel 96 through the open lower end of the processing vessel 96. When thus elevated, the cap 100 hermetically closes the open lower end of the processing vessel 96.

A stretchable, retractable, turnable and vertically movable wafer-boat transfer arm 102 is disposed between the wafer-boat support tables 90 and the cap 100 as located at its lower end position. The wafer boat 44 can be transferred between the wafer-boat support table 90 and the cap 100 by the wafer-boat transfer arm 102.

A top ventilating plate 106 provided with vent holes 104, such as a perforated (punched) metal plate, is provided as a part of a top wall of the housing 32. External clean air of a cleanliness on the order of class 10000 is supplied through the ventilating plate 106 into the housing 32.

A ventilating wall 110 provided with ventilating holes 108 is joined to the top wall of the housing 32 and the partition wall 38 so as to extend above the transfer stage 46 and behind the storage unit 42. An external filter unit 112, such as a HEPA filter, and external fans 114 are disposed on the side of the processing unit 48 with respect to the ventilating wall 110. The external filter unit 112 filters clean air (gas) of a cleanliness on the order of class 10000 taken from an outside area of the housing 32 to create and pass a clean gas of a high cleanliness on the order of class 1. The clean gas of the high cleanliness is adapted to be supplied into the carrying-box handling area 34.

Referring to FIGS. 2 and 3, the contamination preventing duct 52, which is a main feature of the present invention, has a duct body 120 having open upper and lower ends and a shape substantially resembling a rectangular solid. A substantially square opening 122 slightly greater than the lid 10 of the carrying box 2 is formed in a front wall of the duct body 120. The duct body 120 is made of, for example, a stainless steel. The open upper end and the open lower end of the duct body 120 define a gas inlet 124 and a gas outlet 126, respectively. A clean gas of a high cleanliness can flow through the duct body 120 as described below. An actuating rod 130 of a duct actuator 128 (FIG. 1), such as a pneumatic cylinder actuator, which is disposed at a base wall of the housing 32, is connected to a side wall of the duct body 120 to move the duct body 120 vertically.

The duct body 120 has, for example, a height H1 in the range of about 400 to about 600 mm, a length H2 in the range of about 500 to about 550 mm and a width H3 in the range of about 100 to about 200 mm. The width H4 of the substantially square opening 122 is in the range of about 300 to about 400 mm when the carrying box 2 is designed for carrying 12 in. diameter wafers. Since the duct body 120 has the big width H3 in the range of about 100 to about 200 mm, the first lid operating mechanism 50 and the information acquiring device 61 can be disposed side by side in the duct body 120.

A filter unit 132 that creates and passes a clean gas of a high cleanliness is disposed right above the contamination preventing duct 52. In detail, the filter unit 132 is formed by fitting a filter member 134, such as a HEPA filter, in a frame 136. Two fans 138 are attached to an upper area of the filter unit 132 to blow a gas downward in FIG. 2. The frame 136 has an open upper end and an inclined bottom part 136B. A discharge duct 140 of a size substantially equal to that of the gas inlet 124 of the duct body 120 extends downward from a lower end of the bottom part 136B toward the duct body 120, which is positioned below the filter unit 132. Thus, a clean gas of a high cleanliness is adapted to be supplied from the discharge duct 140 into the duct body 120.

An operation of the processing system 30 thus formed will be described hereinafter.

An inert gas atmosphere, such as $N_2$ gas atmosphere, is created in the wafer handling area 36 in order to prevent the formation of an oxide film on the surfaces of wafers W by natural oxidation.

A clean air atmosphere is maintained in the carrying-box handling area 34. More concretely, clean air of, for example, a cleanliness class 10000 is taken through the top ventilating plate 106 of the housing 32, the external filter unit 112 filters the clean air to provide highly clean air of a cleanliness on the order of class 1, and the highly clean air flows through the ventilating wall 110 into the carrying-box handling area 34. The highly clean air flows through the carrying-box handling area 34 and is discharged through a bottom part of the carrying-box handling area 34.

First, a general flow of semiconductor wafers W will be explained. A carrying box 2 delivered from an external device to the processing system 30 is placed onto the outside table 56 with the lid 10 thereof facing the opening 54. The duct body 120 of the contamination preventing duct 52 is elevated, and clean air of a high cleanliness on the order of class 1 is kept flowing downward through the duct body 120. Then, the first lid operating mechanism 50 is driven to remove the lid 10 of the carrying box 2 temporarily, and then the number, the positions and so on of wafers W contained in the carrying box 2 are detected by means of the sensing head 74 of the information acquiring device 61. After necessary information has been thus acquired, the first lid operating mechanism 50 is driven again to fit the lid 10 on the box body of the carrying box 2.

Subsequently, the contamination preventing duct 52, the first lid operating mechanism 50 and the information acquiring device 61 are retracted (evacuated) from their working positions, the sliding plate 60 located on the outside table 56 is advanced to transfer the carrying box 2 to the inside table 58.

Then, the carrying arm 79 is driven so as to hold the carrying box 2 placed on the inside table 58, and the elevator 78 is driven to carry the carrying box 2 held by the carrying arm 79 to a predetermined position in the storage rack 76 of the storage unit 42 for temporary storage. A carrying box 2 containing desired wafers W and previously placed in the storage rack 76 is retrieved by the carrying arm 79 from the storage unit 42, the elevator 78 is driven to lower the carrying arm 79 holding the carrying box 2, and the carrying arm 79 is controlled to transfer the carrying box 2 onto the second table 82 of the transfer stage 46. The carrying box 2 is placed on the second table 82 with the lid 10 thereof facing the door 86 closing the opening 80 of the partition wall 38. In addition, the carrying box 2 is pressed against the partition wall 38 and is held stationary on the second table 82 by the horizontal actuator 84.

Then, the door 86 is slid to open the opening 80. No gas is able to flow through the opening 80 between the areas 34 and 36 because the rim defining the open front side of the carrying box 2 is closely and hermetically pressed against the partition wall 38. Then, the second lid operating mechanism 51 is driven to remove the lid 10 of the carrying box 2, the wafer transfer arm 92 and the elevator 94 are driven to transfer the wafers W one by one or the plurality of wafers W at a time from the carrying box 2 to the wafer boat 44 set on a wafer boat support table 90. After all the wafers W have been transferred to the wafer boat 44, the wafer boat transfer arm 102 is driven to transfer the wafer boat 44 from the wafer-boat support table 90 to the cap 100 located at its lowermost position. Then, the elevator 98 is driven to elevate the cap 100 supporting the wafer boat 44 thereon to carry the wafer boat 44 through the lower open end of the processing vessel 96 of the processing unit 48 into the processing vessel 96 in order to load the wafers W into the processing vessel 96. The cap 100 closes the lower open end of the processing vessel 96 hermetically. In this state, the wafers W are subjected to a predetermined heat treatment process, such as a film deposition process, an oxidation-enhanced diffusion process or the like.

After the completion of the predetermined heat treatment process, the foregoing steps are reversed to take out the processed wafers W from the processing vessel 96. That is, the wafer boat 44 is lowered in order to unload the processed wafers W from the processing vessel 96, and the wafer boat 44 is placed onto the wafer boat support table 90. Subsequently, the wafer transfer arm 92 is operated to transfer the processed wafers W from the wafer boat 44 to the carrying box 2 placed on the second table 82. After all the processed wafers W have been transferred into the carrying box 2, the second lid operating mechanism 51 is driven to fit the lid 10 on the box body of the carrying box 2.

Then, the door 86 is closed to isolate the areas 34 and 36 hermetically from each other. Then, the carrying arm 79 is driven to carry the carrying box 2 into the storage unit 42 for temporary storage or to carry the carrying box 2 directly onto the inside table 58. The carrying box 2 is carried out of the processing system 30 through the opening 54. The foregoing flow of the carrying box 2 is only an example and, naturally, the flow of the carrying box 2 is not limited thereto.

An operation of the contamination preventing duct 52 and the peripheral members will be described with reference to FIG. 4, which is a view of assistance in explaining the operation of the contamination preventing duct 52 and other members associated therewith.

First, the carrying box 2 is placed on the outside table 56, which is spaced from the opening 54, as shown in FIG. 4(A). Then, the duct body 120 of the contamination preventing duct 52 is raised so that the substantially square opening 122 thereof coincides with the opening 54, as shown in FIG. 4(B). In this state, the fans 138 of the filter device 132 (FIG. 2) are driven to cause highly clean air F of a cleanliness on the order of class 1 to flow down through the duct body 120.

As shown in FIG. 1, clean air supplied into the carrying-box handling area 34 has a cleanliness on the order of class 1. However, the cleanliness of the clean air reduces while the clean air flows through the storage unit 42 and so on. Therefore, the clean air is filtered again by the filter member 134 to improve the cleanliness of the air flowing through the duct body 120. Although it is desirable that the upper end of the duct body 120 raised to its working position is located as close as possible to the lower end of the discharge duct 140 of the filter unit 132, the filter unit 132 is disposed in such a manner that a small gap of L1 (FIG. 3) is secured between the lower end of the discharge duct 140 of the filter unit 132 and the upper end of the raised duct body 120 in order to prevent emanation of particles. Preferably, the gap L1 is in the range of, for example, about 0.2 to about 0.3 mm.

Then, as shown in FIG. 4(c), the carrying box 2 is clamped on the sliding plate 60 (FIG. 1) by a clamping mechanism, not shown, and the sliding plate 60 is advanced toward the housing 32 to locate the carrying box 2 so as to face the opening 54. In this state, it is preferable that the distance between the opening 54 and the front end of the carrying box 2 is in the range of 0 to about 0.5 mm.

Figure 4:
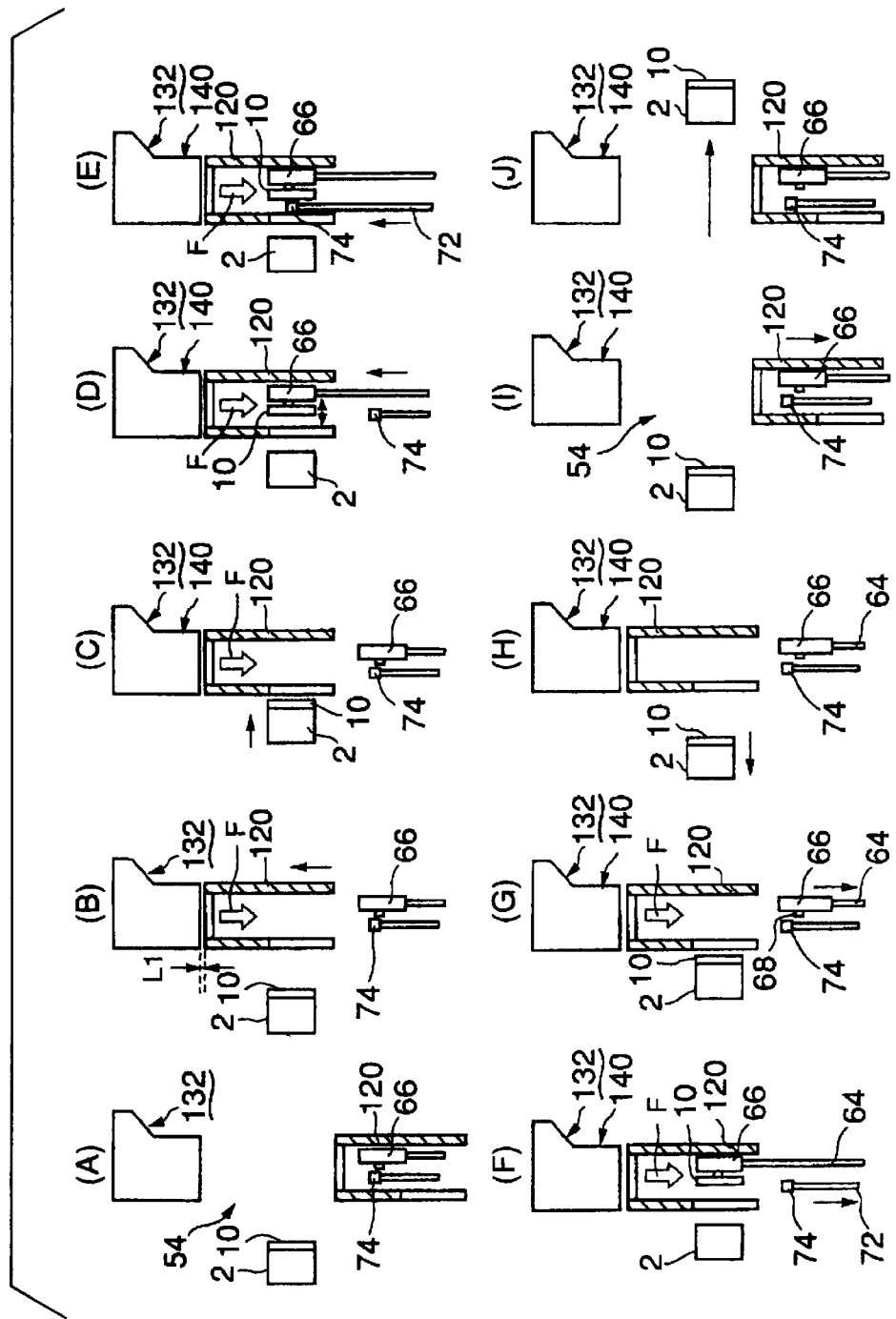
FIG. 4 is a view of assistance in explaining operations of the contamination preventing duct and other members associated therewith.

Then, as shown in FIG. 4(D), the first lid operating mechanism 50 (FIG. 1) is driven. Consequently, the lid operating head 66 is raised, the lock operating members 68 are advanced and turned to unfasten the locking mechanisms of the lid 10 of the carrying box 2. Then, the lock operating members 68 are retracted to remove the lid 10 from the box body of the carrying box 2. At that time, the lid 10 is held by the lock operating members 68. Although the carrying box 2 is thus opened, particles adhering to the outer surface or the like of the carrying box 2 do not enter the open carrying box 2, because the clean air of a high cleanliness of class 1 is flowing through the duct body 120. Thus, contamination of the wafers W contained in the carrying box 2 with particles can be prevented. Although the distance between the carrying box 2 with the lid 10 removed and the duct body 120 is exaggerated in FIG. 4 to facilitate understanding, actually, the carrying box 2 is disposed very close to the duct body 120.

Then, as shown in FIG. 4(E), the information acquiring device 61 (FIG. 1) is driven to scan the interior of the open carrying box 2 by means of the sensing head 74 by vertically moving the rod 72. Thus, the positions of the wafers W contained in the carrying box 2 are measured and/or the wafers W are respectively identified. In addition, for example, a mapping operation is also carried out.

Then, as shown in FIG. 4(F), the rod 72 is moved down to retract (evacuate) the sensing head 74 from its working position behind the opening 54.

Subsequently, as shown in FIG. 4(G), the lid operating head 66 is driven for reverse motions to fit again and lock the lid 10 held by the lock operating members 68 on the box body of the carrying box 2. Then, the rod 64 is moved down to retract (evacuate) the lock operating members 68 from their working positions behind the opening 54. The supply of the clean air F may be stopped after the lid 10 has been put again on the box body of the carrying box 2 to seal again the carrying box 2.

Then, as shown in FIG. 4(H), the sliding plate 60 (FIG. 1) supporting the carrying box 2 thereon is retracted slightly in order to avoid interference between the sliding plate 60 and the duct body 120.

Subsequently, as shown in FIG. 4(I), the duct body 120 is lowered (evacuated) away from its working position behind the opening 54.

Then, as shown in FIG. 4(J), the sliding plate 60 (FIG. 1) supporting the carrying box 2 thereon is advanced to a position on the insidetable 58 (FIG. 1). Thus, the carrying box 2 is taken in the carrying-box handling area 34. Subsequently, the foregoing steps are executed to move the carrying box 2 along the aforesaid course.

In the processing system of the embodiment, the operations for acquiring information about the wafers W contained in the carrying box 2 are carried out after removing the lid 10 of the carrying box 2 with the open front side (504) of the carrying box 2 facing the duct body 120 through which the clean air of a high cleanliness is flowing. Therefore, particles adhering to the outer surface or the like of the carrying box 2 may be taken away by the downflow of the clean air. Consequently, entrance of those particles into the carrying box 2 and the resultant contamination of the wafers W with those particles can be prevented.

Since the clean air flows through the duct body 120, a positive pressure prevails in the duct body 120 and hence a part of the clean air leaks outside through gaps between the members, which may further ensure the prevention of the entrance of those particles into the open carrying box 2.

Particles emanating from the first lid operating mechanism 50 when the first lid operating mechanism 50 operates to open the lid 10 and those emanating from the information acquiring device 61 when the information acquiring device 61 operates may be also carried away by the downflow of the clean air flowing through the duct body 120. Consequently, entrance of those particles into the open carrying box 2 can be prevented.

The aforesaid dimensions of the duct body 120 are only examples and, naturally, the dimensions of the duct body 120 may be not limited thereto. Although the first lid operating mechanism 50 and the information acquiring device 61 are formed separately in the first embodiment, the first lid operating mechanism 50 and the information acquiring device 61 may be integrated into a single unit.

Figure 5:
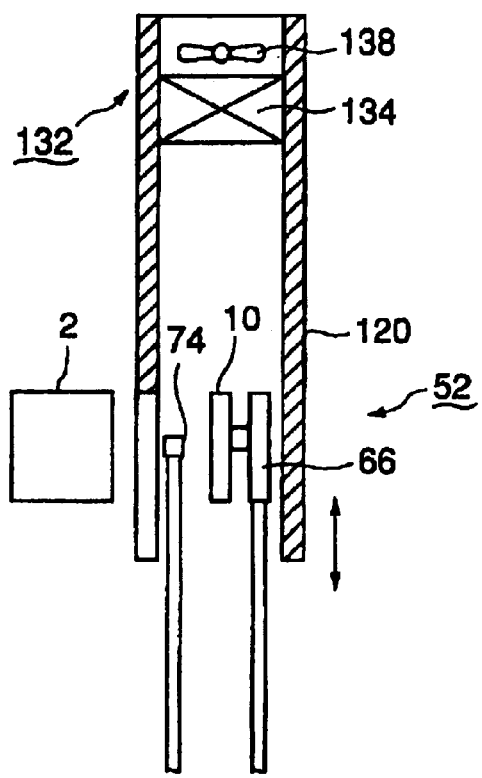
FIG. 5 is a schematic view of a contamination preventing duct in a modification.

Although the duct body 120, the filter unit 132 and the fans 138 are formed separately in the first embodiment, as shown in FIG. 5, the filter unit 132 and the fans 138 may be miniaturized and may be integrally joined to the upper end of the duct body 120.

Although the invention has been described as applied to the processing system for processing semiconductor wafers, the present invention is applicable also to processing systems respectively for processing glass substrates, LCD substrates and the like.

A processing system in a second embodiment according to the present invention will be described with reference to FIGS. 9 and 10. Components of a vertical heat treatment system installed in a clean room C are arranged in a housing 201. The interior f the housing 201 is divided into the carrying-box handling area Sa in which the carrying box 202 is received, sent out and stored, and a wafer handling area Sb in which semiconductor wafers W are transferred between the carrying box 202 and a wafer boat 203 and the wafer boat 203 is loaded into and unloaded from a heat treatment furnace 204 (processing vessel).

Figure 16:
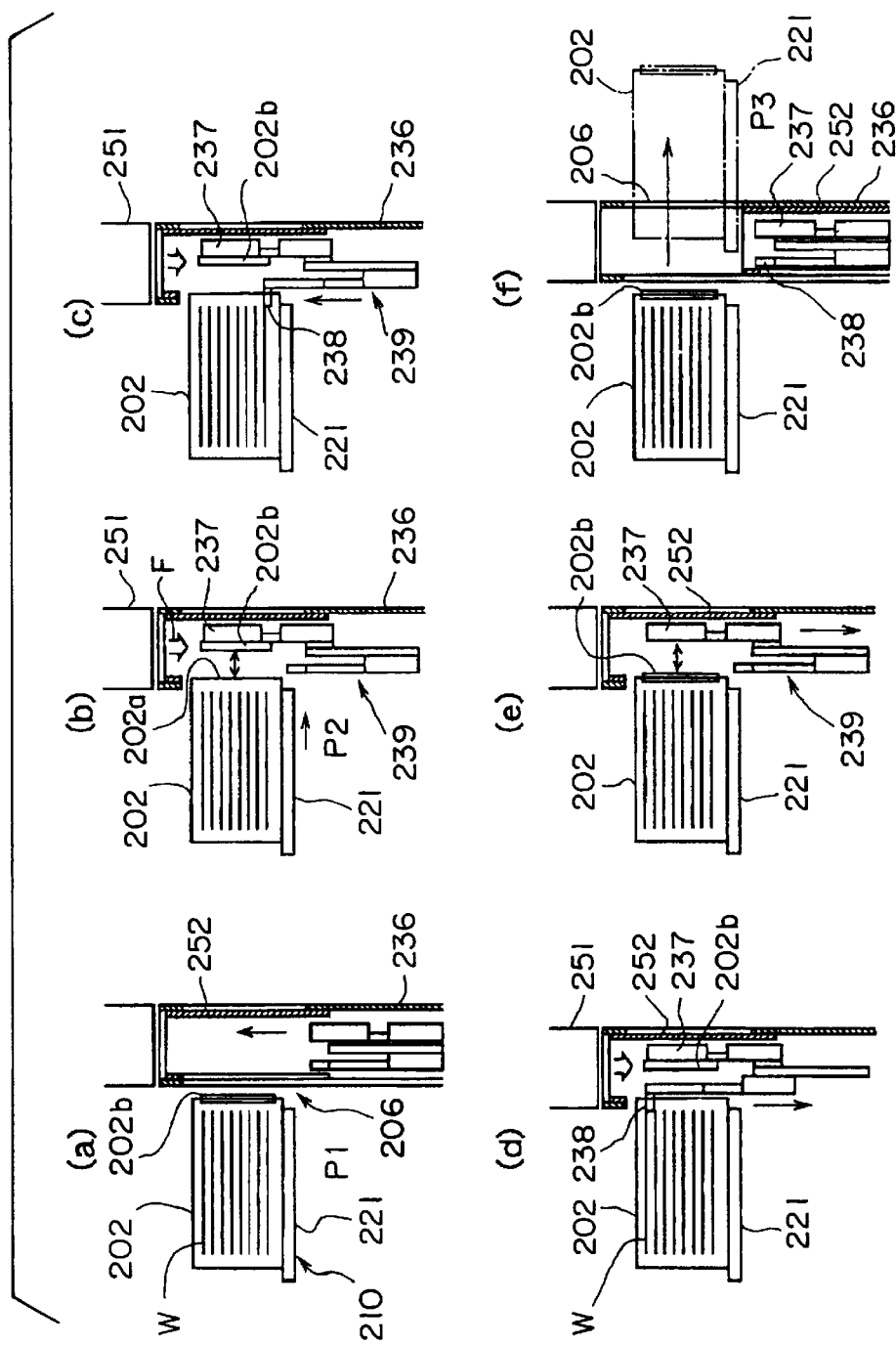
FIG. 16 is a view of assistance in explaining operations of the moving mechanism and the associated mechanisms.

Referring to FIG. 16, the carrying box 202 is a lidded carrying vessel of a plastic material (so-called closed-type carrier) capable of containing, for example, thirteen or twenty-five objects to be processed, such as wafers W, of, for example, 300 mm in diameter in a horizontal posture at predetermined vertical intervals. A front opening 202a of the carrying box 202, through which wafers may be inserted in and taken out of the carrying box 202, is hermetically covered by a lid 202b that is detachably attached to an open front side of the carrying box 202. The lid 202b is provided with a locking mechanism, not shown, that holds the lid 202b on the carrying box 202 at the open front side. The locking mechanism may be unfastened to remove the lid 202b from the carrying box 202.

Figure 9:
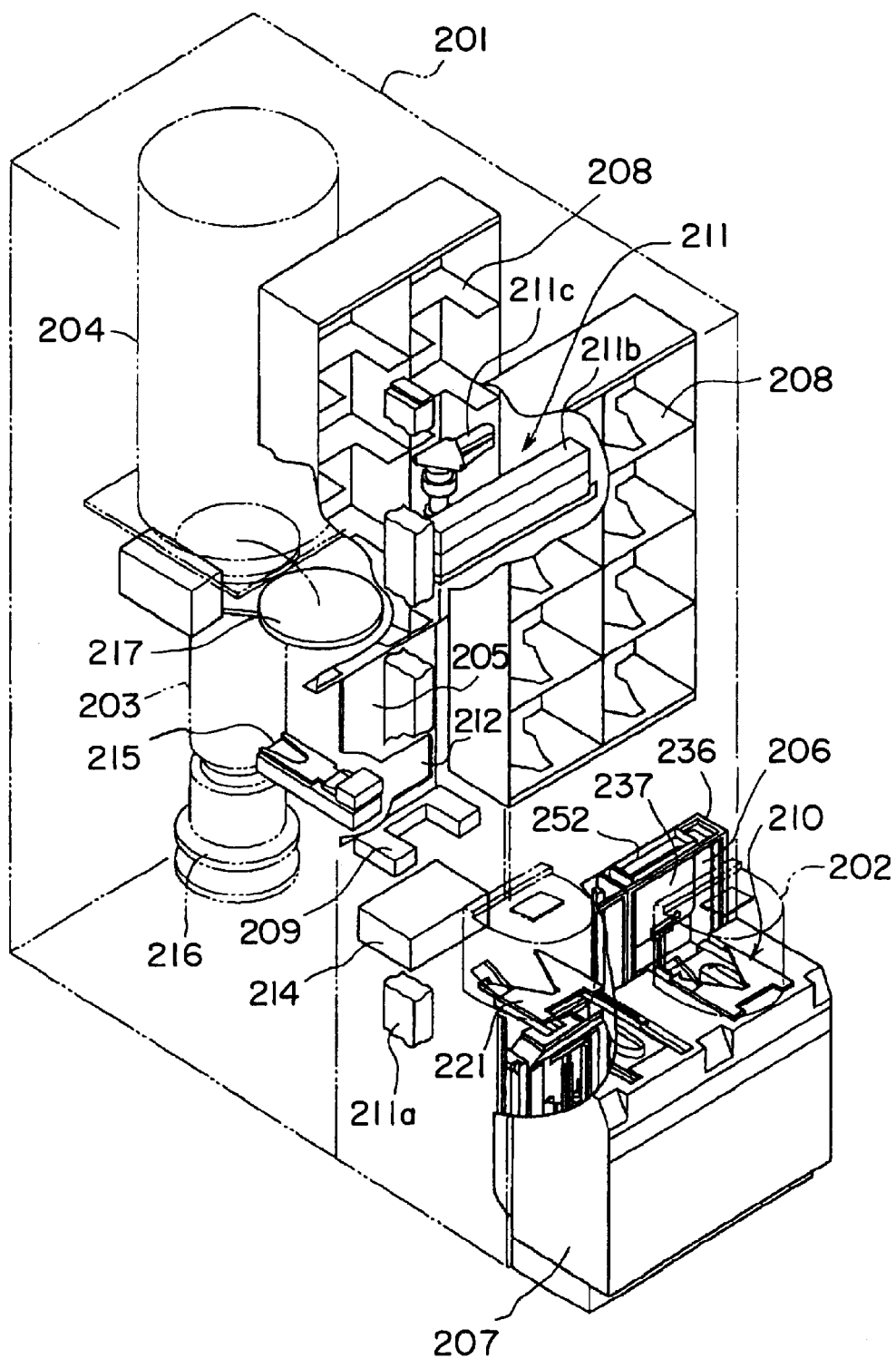
FIG. 9 is a perspective view of a processing system in a second embodiment according to the present invention.
Figure 10:
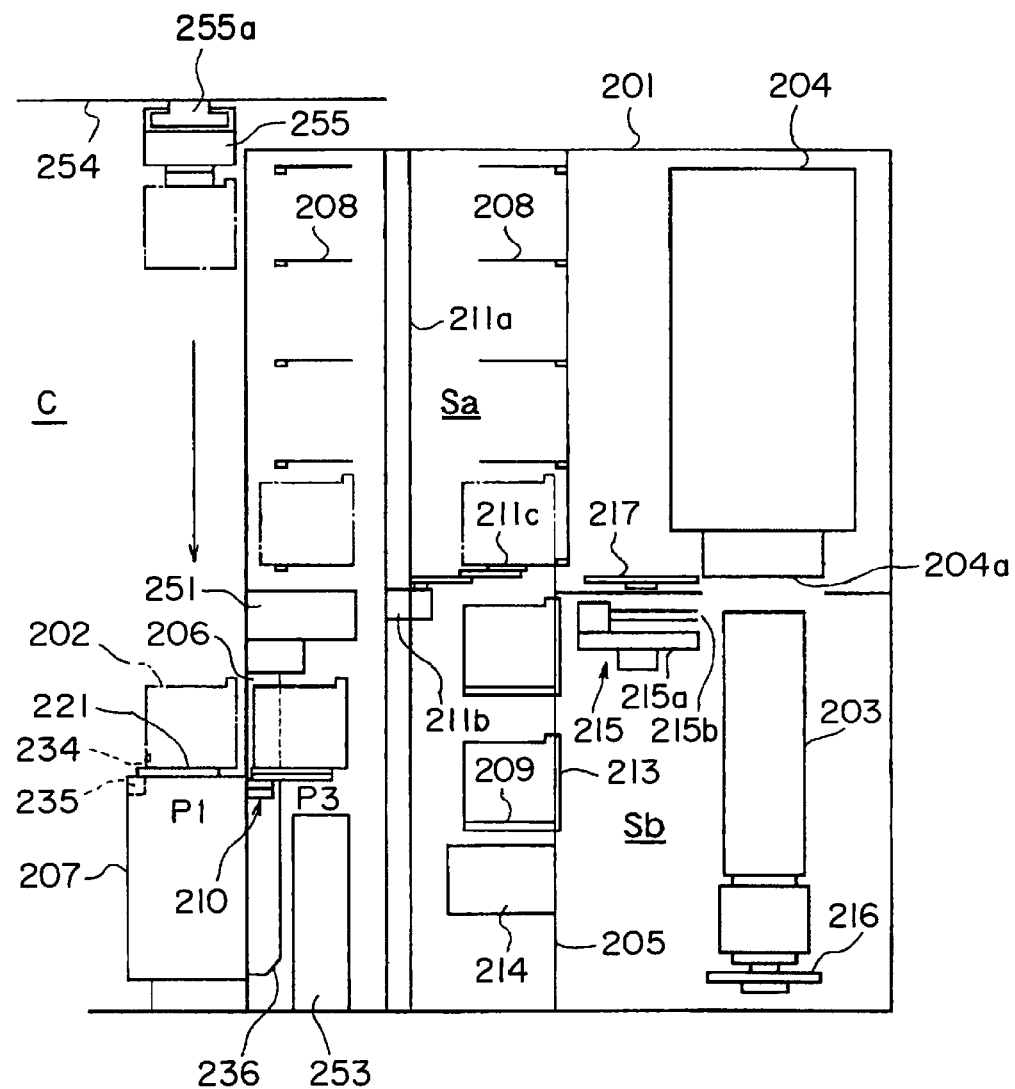
FIG. 10 is a longitudinal sectional view of the vertical heat treatment system shown in FIG. 9.

As shown in FIGS. 9 and 10, an opening 206 is formed in a front part of the housing 201. The carrying box 202 is carried into and out of the housing 201 through the opening 206. A table 207 for supporting the carrying box 202 thereon is installed on the outer side of the opening 206. Storage racks 208 for temporarily storing a plurality of carrying boxes 202 are disposed opposite to each other in a front and a back part of an upper region of the carrying-box handling area Sa. A transfer stage 209 on which the carrying box 202 is placed when taking out wafers from the carrying box 202 and inserting wafers into the carrying box 202 is disposed in a lower region of the carrying-box handling area Sa on the side of a partition wall 205.

Moving mechanisms 210 combined with the table 207, and a conveying mechanism (carrier-box conveying mechanism) 211 for carrying the carrying box 202 between the storage racks 208 and the transfer stage 209 are installed in the carrying-box handling area Sa. The conveying mechanism 211 has, as essential components, an elevating arm 211b which may be vertically moved by an elevating mechanism 211a provided on one side of the carrying-box handling area Sa, and a carrying arm 211c supported on the elevating arm 211b to hold the carrying box 202 and to carry the same horizontally.

The carrying-box handling area Sa communicates with the clean room C by means of the opening 206. A clean air atmosphere of clean air or an inert gas atmosphere of an inert gas, such as $N_2$ gas, is created in the wafer handling area Sb. The wafer handling area Sb is maintained in a cleanliness higher than that of the clean room C.

The partition wall 205 is provided with an opening 212. A carrying box 202 is placed on the transfer stage 209 in the carrying-box handling area Sa in such a manner that the carrying box 202 comes in contact with the partition wall 205 and can be opened through the opening 212 into the wafer handling area Sb. A door 213 is disposed in the wafer handling area Sb so as to close the opening 212. The opening 212 has a size substantially the same as that of the opening 202a of the carrying box 202. Wafers W can be taken out and inserted in the carrying box 202 through the opening 212.

The door 213 is provided with a lid operating mechanism, not shown, that can operate (open and close) the lid of the carrying box 202. A door operating mechanism, not shown, that can operate (open and close) the door 213 is disposed in the wafer handling area Sb. In a state where the door 213 is opened and the lid is removed from the carrying box 202 to open the carrying box 202 into the wafer handling area Sb, the door operating mechanism is adapted to evacuate the door 213 and the lid upward or downward in such a manner that the door 213 and the lid do not obstruct operations for transferring semiconductor wafers W.

A notch aligning mechanism 214 is disposed below the transfer stage 209. The notch aligning mechanism 214 is adapted to align notches formed in the peripheries of wafers W to indicate the specific crystal orientation of the wafers W. The notch aligning mechanism 214 is opened into the wafer handling area Sb. Thus, the notch aligning mechanism 214 can align the notches of wafers W taken out from the carrying box 202 on the transfer stage 209 by a transfer mechanism 215 that is explained below.

A cap 216 is disposed in an upper region of an inner part of the wafer handling area Sb. A wafer boat 203 capable of holding a large number of, for example, 50 to 150 semiconductor wafers W at predetermined vertical intervals is supported on the cap 216. The wafer boat 203 is made of, for example, quartz. The cap 216 can be vertically moved by an elevating mechanism, not shown, to load the wafer boat 203 holding wafers w into and unloading the same from the heat treatment furnace 204. When elevated, the cap 216 is adapted to close an open lower end 204a of the heat treatment furnace 204. A shutter 217 capable of horizontally moving is disposed near the open end 204a in order to close the open end 204a after the cap 216 has been lowered to unload the wafer boat 203 holding processed wafers W from the heat treatment furnace 204.

The transfer mechanism 215 disposed in the wafer handling area Sb is adapted to transfer semiconductor wafers W between the carrying box 202 placed on the transfer stage 209 and the wafer boat 203. More concretely, the transfer mechanism 215 is adapted to transfer unprocessed wafers W from the carrying box 202 placed on the transfer stage 209 to the notch aligning mechanism 214 and from the notch aligning mechanism 214 to the wafer boat 203, and to transfer processed wafers W from the wafer boat 203 to an empty carrying box 202 placed on the transfer stage 209. The transfer mechanism 215 includes a base 215a capable of vertically (up and down) and horizontally moving and turning in a horizontal plane, and one or five thin fork-like support arms 215b supported on the base 215a in a forward and backward movable manner and capable of supporting one or five wafers.

Two wafer boats 203 may be used in the wafer handling area Sb to enhance throughput of the processing system. When two wafer boats 203 are used, wafers are loaded on or unloaded from one of the wafer boats 203 while the other wafer boat 203 holding wafers W is subjected to a heat treatment process.

Figure 13A:
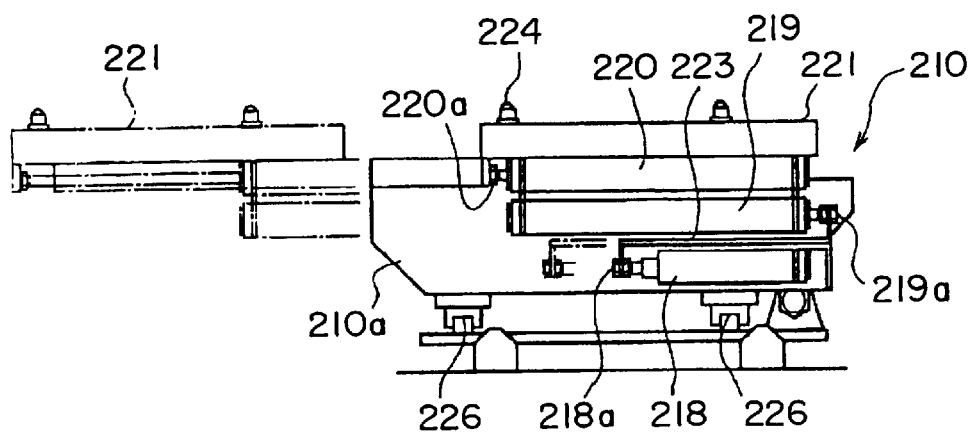
FIG. 13A is a side elevation of a moving mechanism.
Figure 13B:
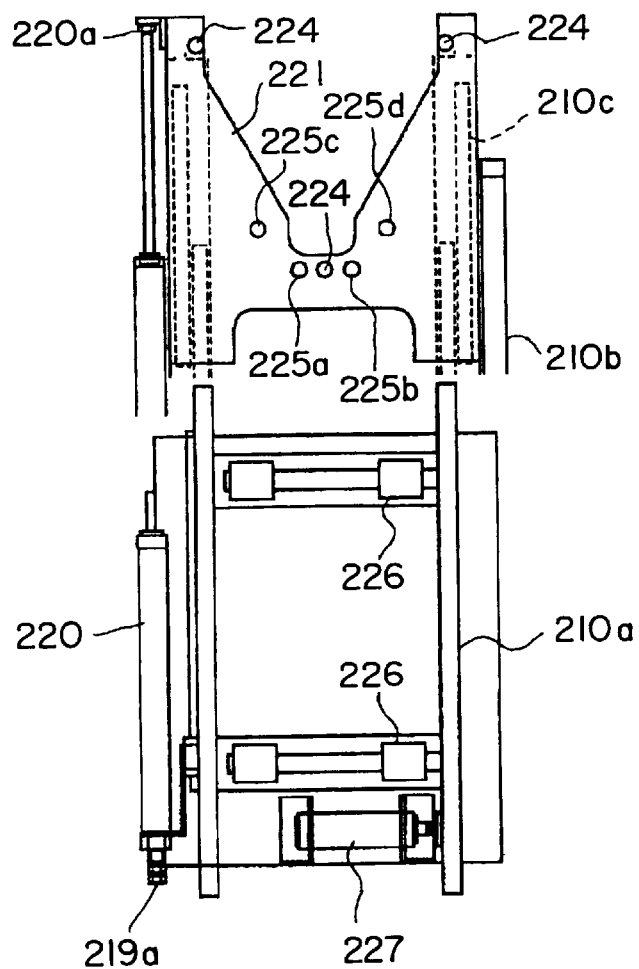
FIG. 13B is a plan view of the moving mechanism shown in FIG. 13A.

The moving mechanisms 210 combined with the table 207 disposed on the outer side of the opening 206 of the housing 201 are capable of moving the carrying box 202 placed on the table 207 to a transfer position p3 where the carrying box 202 can be transferred to the conveying mechanism 211. The two moving mechanisms 210 are arranged side by side on the table 207 so that two carrying boxes 2 can be placed on the table 207 at a predetermined interval of, for example, 505 mm. As shown in FIGS. 11 to 13, each moving mechanism 210 has a movable plate 221 that can be advanced from a waiting position p1 on the table 207 to the transfer position p3 and can be retracted from the transfer position p3 to the waiting position p1 along a linear guide by a first pneumatic cylinder actuator 218, a second pneumatic cylinder actuator 219 and a third pneumatic cylinder actuator 220.

Each moving mechanism 210 also has a three-section stretchable frame structure including a base frame 210a, an intermediate frame 210b and a front frame 210c, which are movable along a linear guide. The movable plate 221 is mounted on the front frame 210c. The first pneumatic cylinder actuator 218 is used for operating both a fixing mechanism 222 (FIG. 12) and the movable plate 221 for their forward and backward movements. A connecting frame 223 connects a free end 218a of a piston rod of the first pneumatic cylinder actuator 218 and a free end 219a of a piston rod of the second pneumatic cylinder actuator 219. The second pneumatic cylinder actuator 219 and the third pneumatic cylinder actuator 220 are connected in parallel to each other with free ends 219a and 220a of respective piston rods of the second pneumatic cylinder actuator 219 and the third pneumatic cylinder actuator 220 directed in opposite directions. The free end 220a of the piston rod of the third pneumatic cylinder actuator 220 is connected to the movable plate 221.

A plurality of positioning pins 224, for example, three positioning pins 224 are attached to the movable plate 221 to position the carrying box 202 on the movable plate 221. A carrying-box detector is mounted on the movable plate 221 to determine whether or not the carrying box 202 is located correctly on the movable plate 221. A plurality of identification pins, for example, four identification pins 225a, 225b, 225c and 225d are arranged on and projected from the movable plate 221 to identify the type of the carrying box 202. Two identification pins 225a and 225b among them are able to sink (disappear) below the surface of the movable plate 221. The two identification pins 225a and 225b are biased outward by springs so as to project from the surface of the movable plate 221. One or more sensors are provided to detect a state wherein the identification pins 225a and 225b sink. A carrying box 202 may be provided in its bottom wall with one or some or all of holes that respectively correspond to the identification pins 225a to 225d. For example, the hole corresponding to the pin 225a is formed or not formed to discriminate between a carrying box 202 holding twenty-five wafers and a carrying box 202 holding thirteen wafers, the hole corresponding to the pin 225b is formed or not formed to discriminate between a carrying box 202 of a closed type and a carrying box 202 of an open type (provided with no lid), and the holes corresponding to the pins 225c and 225d are formed or not formed to discriminate between a carrying box 202 for the preceding process and a carrying box 202 for the succeeding process. If the holes formed in the carrying box 202 do not coincide with the pins, the carrying box 202 is seated in an irregular position (posture) on the movable plate 221. A carrying box 202 in such an irregular position can be detected by a carrying-box sensor.

The moving mechanisms 210 are capable of laterally moving toward a center therebetween because the conveying mechanism 211 is able to operate in only a narrow operatable range. Each moving mechanism 210 is provided with the fixing mechanism 222 capable of temporarily fixing the carrying box 202 on the table 207 as shown in FIGS. 12 to 14, in order to prevent the operator from mistakenly taking away the carrying box 202 placed on the table 207. More concretely, the base frame 210a of the moving mechanism 210 is mounted on the table 207 in a movable manner laterally along a linear guide 226. The base frame 210a is laterally moved by a pneumatic cylinder actuator 227. Thus, the lateral interval of 505 mm between the two carrying boxes 202 placed on the table 207 can be reduced to an interval of, for example, 475 mm corresponding to the operatable range of the conveying mechanism 211.

A movable frame 228 is mounted on the base frame 210a for longitudinal movement along a linear guide 229. The first pneumatic cylinder actuator 218 moves forward and backward the movable frame 228. A lifting frame 230 included in the fixing mechanism 222 is supported on the movable frame 228 for vertical movement. An elevating pneumatic cylinder actuator 231 vertically moves up and down the lifting frame 230. Thus, the lifting frame 230 of the fixing mechanism 222 can be vertically and longitudinally movable. A hook 232 is pivotally supported on the lifting frame 230 and the piston rod of a pneumatic cylinder actuator 233 is operatively connected to the hook 232. Thus, the hook 232 can be engaged with and disengaged from a projection formed in a recess 202c formed in the outer surface of the bottom wall of the carrying box 202 by the pneumatic cylinder actuator 233. When the carrying box 202 is placed on the movable plate 221 located at the waiting position p1 on the table 207, the fixing mechanism 222 raises the lifting frame 230 to a position near the bottom wall of the carrying box 202, and engages the hook 232 with the projection formed in the recess 202c of the carrying box 202 to fix the carrying box 202 on the movable plate 221. The carrying box 202 is kept fixed on the movable plate 221 until the carrying box 202 is advanced to a wafer counting position (a lid removing position) p2. Thus, the operator cannot take away the carrying box 202 as long as the same is placed on the table 207.

When the carrying box 202 is moved from the wafer counting position p2 to the transfer position p3 where the carrying box 202 can be transferred to the conveying mechanism 211, the hook 232 of the fixing mechanism 222 is disengaged from the carrying box 202 and the lifting frame 230 is lowered to avoid obstructing the movement of the carrying box 202. The first pneumatic cylinder actuator 218 of the moving mechanism 210 is driven to advance the movable plate 221 together with the lifting frame 230 from the waiting position p1 on the table 207 to the wafer counting position p2, and then the second pneumatic cylinder actuator 219 and the third pneumatic cylinder actuator 220 are driven to advance the movable plate 221 to the transfer position p3 where the carrying box 202 can be transferred to the conveying mechanism 211.

The carrying box 202 has an information recording part 234 in which information about the carrying box 202 is recorded. The table 207 is provided with an information reader 235 capable of reading the information recorded in the information recording part 234. The information recording part 234 and the information reader 235 may be of any suitable type, such as a bar-code type, an infrared type or a radio-wave type. The information reader 235 may be capable of writing information to the information recording part 234.

Referring to FIG. 10, a frame 236 provided with the opening 206 is disposed behind the table 207. The clean room C communicates with the carrying-box handling area Sa in the housing 201 by means of the opening 206. As shown in FIG. 16(b), the front end of the carrying box 202 lies in the opening 206 of the frame 236 when the carrying box 202 is located at the wafer counting position p2. A lid operating mechanism 237 for temporarily removing the lid 202b of the carrying box 202 located at the wafer counting position p2, and a detecting device 239 including a sensor 238 which is inserted into the carrying box 202 after the lid 202b has been removed, are placed in the frame 236. The detecting device 239 measures the positions of wafers W contained in the carrying box 202 and counts the number of the same. The lid operating mechanism 237 and the detecting device 239 can be vertically moved by a pneumatic cylinder actuator, not shown. The lid operating mechanism 237 and the detecting device 239 are lowered when moving the carrying box 202 into the housing 201 to avoid obstructing the movement of the carrying box 202.

The lid operating mechanism 237 opens the lid 202b of the carrying box 202 by the steps of: approaching the lid 202b of the carrying box 202 located at the wafer counting position p2, unfastening the locking mechanism of the lid 202b, holding the lid 202b by a suction mechanism or a mechanical clamping mechanism, and removing the lid 202b from the carrying box 202. The lid operating mechanism 237 reverses those steps to close the lid 202b after the number of the wafers W has been counted.

As shown in FIG. 15, the detecting device 239 has a stepping motor 240, a ball screw 241, a box-shaped body 242, a pneumatic cylinder actuator 243, such as a rodless cylinder actuator, and a lifting member 244. The stepping motor 240 drives a threaded rod of the ball screw 241 to move the body 242 vertically. The pneumatic cylinder actuator 243 moves the lifting member 244 vertically in the body 242. A bracket 246 is supported on rods 245 that are set upright on the lifting member 244 and vertically extend through an upper wall 242a of the body 242. A U-shaped sensor holder 247 holding a sensing device 238 consisting of a light-emitting device and a light-receiving device is supported pivotably for turning in a vertical plane between a standing position and a sidelong position.

An operating rod 248 is extended vertically through the upper wall 242a of the body 242, and its upper end is pivotably connected to an arm projecting from the sensor holder 247 in such a manner that the sensor holder 247 is automatically turned between the standing position and the sidelong position. The body 242 is provided with a stopper 249. The stopper 249 engages the operating rod 248 slightly before the lifting member 244 reaches the upper end of its vertical stroke, so that the sensor holder 247 is turned from the standing position to the sidelong position. A spring 250 is extended between the lower end of the operating rod 248 and the lifting member 244 in order to urge the sensor holder 247 to stand up when the lifting member 244 starts moving down from the upper end of its vertical stroke. When the sensor holder 247 is turned from the standing position to the sidelong position, the sensing device 238 is inserted into the carrying box 202. Thus, the number and positions of the wafers W can be surely and easily measured.

A filter unit 251 is disposed at a position above the opening 206 in the carrying-box handling area Sa in the housing 201. The filter unit 251 filters air prevailing in the carrying-box handling area Sa and blows clean air downward to suppress or prevent scatter of particles adhering to the carrying box 202 and contamination of the wafers W with the scattered particles when the lid 202b of the carrying box 202 is opened. A vertically movable duct 252 is placed in the frame 236. The duct 252 surrounds the opening 202a of the carrying box 202 and the lid 202b removed forward from the carrying box 202 into the frame 236, and carries and guides clean air downward. The duct 252 can be lowered by a pneumatic cylinder actuator, not shown, before moving the carrying box 202 into the carrying-box handling area Sa in order to avoid obstructing the movement of the carrying box 202.

An electrical unit 253 including electric devices for controlling the conveying mechanism 211, the moving mechanism 210 and the like is disposed below the transfer position p3 where the carrying box 202 can be transferred to the conveying mechanism 211 for effective utilization of space. An overhead traveling hoist (overhead hoist transport) 255 is movably held on a rail 255a attached to the ceiling 254 of the clean room C in order to carry the carrying box 202. The waiting position p1 on the table 207, where the carrying box 202 can be transferred between the overhead traveling hoist 255 and the table 207, is right below the overhead traveling hoist 255.

An operation of the vertical heat treatment system thus constructed will be described. The overhead traveling hoist 255 carries the carrying box 202 to the vertical heat treatment system and places the carrying box 202 onto the movable plate 221 placed on the table 207, as shown in FIG. 16(a). Then, the identifying device identifies the carrying box 202 by the number of wafers, such as twenty-five or thirteen, and the type, such as an open-type or a closed-type. In addition, the information reader 235 reads the information recorded on the carrying box 202. Carrying boxes 202 not meeting predetermined conditions are rejected.

The lifting frame 230 of the fixing mechanism 222 is raised, and the hook 232 is engaged with the projection formed in the recess 202c formed in the bottom wall of the carrying box 202 to fix the carrying box 202 on the movable plate 221. Then, the moving mechanism 210 combined with the table 207 advances the carrying box 202 to the wafer counting position p2, and the lid operating mechanism 237 is raised and removes the lid 202b from the carrying box 202, as shown in FIG. 16(b). The duct 252 is raised so as to surround the opening 206 before the lid 202b is removed from the carrying box 202. Clean air F of a high cleanliness on the order of class 1 filtered (created) by the filter unit 251 flows down through the duct 252. Thus, the scatter of particles adhering to the outer surface or the like of the carrying box 202 and the contamination of the wafers W with the scattered particles can be suppressed or prevented.

Then, the sensor holder 247 in the standing position of the detecting device 239 is raised by the pneumatic cylinder actuator 243, the sensor holder 247 is turned toward the carrying box 202 when the lifting member 244 reaches the upper end of its vertical stroke and, consequently, the sensor 238 is inserted into the carrying box 202, as shown in FIG. 16(c). Then, the stepping motor 240 is actuated to raise the sensor 238 at a predetermined speed for scanning to count the number of wafers W held in the carrying box 202 and to measure the positions of the wafers w (FIG. 16(d)). Those steps are reversed to lower the sensor holder 247 of the detecting device 239 to retract the same from the position corresponding to the opening 206. Then, the lid operating mechanism 237 fits the lid 202b on the carrying box 202 to close the opening 202a, as shown in FIG. 16(e). The supply of the clean air F into the duct 252 by the filter unit 251 may be stopped after the carrying box 202 has been closed hermetically by the lid 202b.

Subsequently, the carrying box 202 is temporarily moved back to the waiting position p1 on the table 207, and the lid operating mechanism 237 and the duct 252 are moved away from the positions corresponding to the opening 206. Then, the carrying box 202 is advanced to the wafer counting position p2, the hook 232 of the fixing mechanism 222 is disengaged from the projection in the recess 202c of the carrying box 202, and the lifting plate 230 is lowered. Then, the carrying box 202 is advanced to the transfer position p3, where the carrying box 202 can be transferred to the conveying mechanism 211, as shown in FIG. 16(f).

Carrying boxes 202 successively delivered to the transfer position p3 are successively carried by the conveying mechanism 211 to the storage racks 208 for temporary storage. The carrying boxes 202 are also carried successively from the storage racks 208 to the transfer table 209 by the conveying mechanism 211. The lid 202b of the carrying box 202 placed on the transfer table 209 is removed, and the door 213 closing the opening 212 of the partition wall 205 is opened. Then, the transfer mechanism 215 transfers the wafers W successively from the carrying box 202 via the notch aligning mechanism 214 to the wafer boat 203. The wafer boat 203 holding the wafers W is loaded into the heat treatment furnace 204 to subject the wafers W to a predetermined heat treatment process. After the heat treatment process has been completed, the foregoing steps of loading the wafers into the heat treatment furnace 204 are reversed to return the processed wafers W from the wafer boat 203 to an empty carrying box 202, and to carry the carrying box 202 onto the table 207 by the conveying mechanism 211 and the moving mechanism 210. The carrying box 202 returned onto the table 207 is carried away from the table 207 by the overhead traveling hoist 255.

The vertical heat treatment system in this embodiment includes: the housing 201 provided with the opening 206, through which the carrying box 202 hermetically sealing (containing) a plurality of wafers W therein is carried into and out of the housing 201, and having the carrying-box handling area Sa and the wafer handling area Sb, in which wafers W are taken out of the carrying box 202 and are subjected to a predetermined process; the conveying mechanism 211 installed in the carrying-box handling area Sa of the housing 201 for conveying the carrying-box 202; the storage racks 208 installed in the carrying-box handling area Sa for storing a plurality of carrying boxes 202; the table 207 disposed outside the housing 201; and a moving mechanism 210 combined with the table 207 to move the carrying box 202 between the waiting position p1 on the table 207 and the transfer position p3 where the carrying box 202 can be received by the conveying mechanism 211. Therefore, the overhead traveling hoist 255 can be used for carrying the carrying box 202 to and from the vertical heat treatment system, which contributes to the improvement of the throughput of the vertical heat treatment system.

Since the moving mechanism 210 is provided with the fixing mechanism 222 for temporarily fixing the carrying box 202 on the moving mechanism 210, operator's mistaken work to mistakenly carry away the carrying box 202 placed on the table 207 can be prevented. Since the two moving mechanisms 210 are arranged side by side and are capable of laterally moving toward the center therebetween, the two moving mechanisms 210 can be located in the narrow operatable range of the conveying mechanism 211, and the vertical heat treatment system can be formed in compact construction, and the throughput of the vertical heat treatment system can be enhanced.

Since the lid operating mechanism 237 for temporarily removing the lid 202b from the carrying box 202, and the detecting device 239 which inserts the sensor 238 into the carrying box 202 after the lid 202b has been removed to count the number of the wafers W and to measure the positions of the wafers W are incorporated into the table 207, the number of the wafers W can be easily and surely counted and the positions of the wafers W can be easily and surely measured in the carrying box 202 placed on the table 207. Since the electrical unit 253 is disposed below the transfer position p3 where the carrying box 202 can be transferred from the moving mechanism 210 to the conveying mechanism 211, the arrangement of cables is facilitated and the vertical heat treatment system can be formed in compact construction.

Although the preferred embodiments of the present invention have been described with reference to the accompanying drawings, the present invention is not limited thereto in its practical application and various changes and variations may be made in their design and such without departing from the scope of the invention. For example, the present invention is applicable not only to the vertical processing system but also to horizontal processing system. Furthermore the present invention is applicable not only to processing systems for processing semiconductor wafers but also to processing systems respectively for processing glass substrates, LCD substrates and the like.

Naturally, the features of the foregoing embodiments can be used in proper combination.

What is claimed is:

1. A processing system for an object to be processed, comprising:

a housing defining a closed space, the housing provided with an opening through which an airtight carrying box is carried in and out, the carrying box hermetically containing therein the object to be processed and provided with a detachable lid;

a lid operating mechanism disposed near the opening to open and close the lid of the carrying box; and a contamination preventing duct capable of covering a space around the lid of the carrying box and of supplying a clean gas of a high cleanliness therein at least when the lid of the carrying box is opened, wherein the contamination preventing duct is capable of being moved vertically between a working position where the contamination preventing duct covers the lid and a waiting position apart from a path along which the carrying box moves.

2. A processing system according to claim 1, wherein a blower is disposed near the opening to blow the clean gas of a high cleanliness into the contamination preventing duct.

3. A processing system according to claim 2, wherein a filter means is disposed near the opening to filter a gas to produce the clean gas of a high cleanliness.

4. A processing system according to claim 3, wherein the blower and the filter means are mounted on a common frame, and an outlet end of the frame is spaced a short distance apart from the contamination preventing duct.

5. A processing system according to claim 1, wherein a storage unit for temporarily storing the carrying box therein is provided in the housing.

6. A processing system according to claim 1, wherein an information acquiring means that acquires information about the object to be processed contained in the carrying box is disposed near the opening.

7. A processing system according to claim 6, wherein the information acquiring means is capable of being moved vertically between an information acquiring position where the information acquiring means faces the carrying box and a waiting position apart from a path along which the carrying box moves.

8. A processing system according to claim 7, wherein the contamination preventing duct is adapted to cover the space around the lid of the carrying box and the clean gas of a high cleanliness is adapted to flow through the contamination preventing duct when the information acquiring means functions to acquire information about the object to be processed contained in the carrying box.

9. A processing system according to claim 1, wherein a processing unit for conducting a predetermined process to the object to be processed contained in the carrying box is provided in the housing.

10. A Processing system for an object to be processed, comprising:

a housing defining a closed space, the housing provided with an opening through which an airtight carrying box is carried in and out, the carrying box hermetically containing therein the object to be processed and provided with a detachable lid;

a conveying mechanism installed in the housing for conveying the carrying box;

a table disposed outside the opening for supporting the carrying box thereon; and a moving mechanism provided at the table for moving the carrying box to a transfer position where the carrying box can be transferred to the conveying mechanism, wherein two moving mechanisms are provided into the one table.

11. The processing system according to claim 10, wherein said table disposed outside the opening for supporting the carrying box thereon is stationary.

12. A processing system according to claim 10, wherein the moving mechanism includes a fixing mechanism for temporarily fixing the carrying box.

13. The processing system according to claim 10, wherein a processing unit for conducting a predetermined process to the object to be processed contained in the carrying box is provided in the housing.

14. A processing system according to claim 10 wherein the two moving mechanisms are capable of laterally moving inward along linear guides towards a center therebetween.

15. A processing system according to claim 10, wherein a lid operating mechanism for opening and closing the lid of the carrying box is provided at the table.

16. A processing system according to claim 10, wherein an information acquiring means that acquires information about the object to be processed contained in the carrying box is provided at the table.

17. A processing system according to claim 10, wherein an electrical unit is disposed below the transfer position where the carrying box can be transferred from the moving mechanism to the conveying mechanism.

18. A processing system according to claim 10, wherein a storage unit for temporarily storing the carrying box therein is provided in the housing.

* * * * *